(12) United States Patent
Mylly

(10) Patent No.: US 10,048,884 B2
(45) Date of Patent: Aug. 14, 2018

(54) METHOD FOR ERASING DATA ENTITY IN MEMORY MODULE

(75) Inventor: Kimmo Mylly, Ylojarvi (FI)

(73) Assignee: Memory Technologies LLC, Kirkland, WA (US)

( * ) Notice: Subject to any disclaimer, the term of this patent is extended or adjusted under 35 U.S.C. 154(b) by 596 days.

(21) Appl. No.: 14/369,680

(22) PCT Filed: Dec. 29, 2011

(86) PCT No.: PCT/FI2011/051168
§ 371 (c)(1),
(2), (4) Date: Nov. 3, 2014

(87) PCT Pub. No.: WO2013/098463
PCT Pub. Date: Jul. 4, 2013

(65) Prior Publication Data
US 2015/0052292 A1  Feb. 19, 2015

(51) Int. Cl.
*G06F 3/00* (2006.01)
*G06F 3/06* (2006.01)
(Continued)

(52) U.S. Cl.
CPC .......... *G06F 3/0643* (2013.01); *G06F 3/0619* (2013.01); *G06F 3/0679* (2013.01);
(Continued)

(58) Field of Classification Search
CPC .... G06F 3/0604; G06F 3/0619; G06F 3/0628; G06F 3/0643; G06F 3/0644;
(Continued)

(56) References Cited

U.S. PATENT DOCUMENTS

| 3,653,001 A | 3/1972 | Ninke |
| 5,337,275 A | 8/1994 | Garner |

(Continued)

FOREIGN PATENT DOCUMENTS

| EP | 2006774 A1 | 12/2008 |
| JP | 1999053248 | 2/1999 |

(Continued)

OTHER PUBLICATIONS

PCT Search Report for Application No. PCT/FI2011/051168, dated May 14, 2012, 4 pgs.
(Continued)

*Primary Examiner* — Ann J Lo
*Assistant Examiner* — Chie Yew
(74) *Attorney, Agent, or Firm* — Lee & Hayes, PLLC

(57) ABSTRACT

This disclosure is directed to systems, apparatuses, and methods of storing a data entity using at least two sectors of a memory device based at least in part on context information of the data entity. For example, the context information may differentiate between large sequential operations and small random operations, and may further improve multi-tasking support. The context information may further improve operations to erase data in the memory device. For example, a method may include storing a data entity using at least two sectors of a memory device, the at least two sectors associated with the same data entity, and maintaining, at a memory controller, context information of the data entity comprising a pointer to at least one of the at least two sectors of the memory device. The method may further include erasing the at least two sectors of the memory device using the context information.

45 Claims, 3 Drawing Sheets

US 10,048,884 B2
Page 2

(51) Int. Cl.
*G06F 12/02* (2006.01)
*G11C 16/16* (2006.01)
*G11C 16/34* (2006.01)
*G06F 12/06* (2006.01)
*G06F 12/1081* (2016.01)
*G06F 13/16* (2006.01)
*G06F 13/28* (2006.01)
*G06F 13/42* (2006.01)

(52) U.S. Cl.
CPC .......... *G06F 12/0246* (2013.01); *G11C 16/16* (2013.01); *G11C 16/349* (2013.01); *G06F 3/0604* (2013.01); *G06F 3/0628* (2013.01); *G06F 3/0644* (2013.01); *G06F 3/0652* (2013.01); *G06F 3/0688* (2013.01); *G06F 12/0238* (2013.01); *G06F 12/0623* (2013.01); *G06F 12/0646* (2013.01); *G06F 12/1081* (2013.01); *G06F 13/1668* (2013.01); *G06F 13/1694* (2013.01); *G06F 13/285* (2013.01); *G06F 13/4234* (2013.01); *G06F 13/4278* (2013.01); *G06F 13/4295* (2013.01); *G06F 2206/1014* (2013.01); *G06F 2212/7205* (2013.01)

(58) Field of Classification Search
CPC .... G06F 3/0652; G06F 3/0679; G06F 3/0688; G06F 12/0246; G06F 12/0238; G06F 12/0623; G06F 12/0646; G06F 12/1081; G06F 13/4234; G06F 13/4278; G06F 13/4295; G06F 13/385; G06F 13/1668; G06F 13/1694; G06F 16/16; G06F 16/349; G06F 2212/7215
USPC ...... 711/103, 151, 154, 156, 166; 710/3, 10, 710/19, 23, 40, 305, 310; 712/13, 209, 712/225, 228, 244
See application file for complete search history.

(56) References Cited

U.S. PATENT DOCUMENTS

| | | | |
|---|---|---|---|
| 5,809,340 A | 9/1998 | Bertone et al. | |
| 6,205,494 B1* | 3/2001 | Williams | G06F 13/38 710/20 |
| 6,279,114 B1 | 8/2001 | Toombs et al. | |
| 6,681,304 B1 | 1/2004 | Vogt et al. | |
| 7,152,801 B2 | 12/2006 | Cuellar et al. | |
| 7,409,489 B2 | 8/2008 | Sinclair | |
| 7,478,248 B2 | 1/2009 | Ziv et al. | |
| 8,307,180 B2 | 11/2012 | Hyvonen et al. | |
| 9,063,850 B2 | 6/2015 | Hyvonen et al. | |
| 2002/0087817 A1 | 7/2002 | Tomaiuolo et al. | |
| 2004/0243900 A1 | 12/2004 | Henkel | |
| 2006/0020744 A1 | 1/2006 | Sinclair et al. | |
| 2006/0280077 A1 | 12/2006 | Suwa | |
| 2007/0079015 A1 | 4/2007 | Royer, Jr. et al. | |
| 2008/0059695 A1 | 3/2008 | Tanaka | |
| 2008/0080688 A1 | 4/2008 | Burgan et al. | |
| 2008/0183953 A1* | 7/2008 | Flynn | G06F 1/183 711/103 |
| 2008/0270680 A1* | 10/2008 | Chang | G11C 16/10 711/103 |
| 2011/0066808 A1* | 3/2011 | Flynn | G06F 12/0246 711/118 |
| 2012/0173795 A1* | 7/2012 | Schuette | G06F 12/0246 711/103 |
| 2012/0304039 A1* | 11/2012 | Peterson | G06F 11/10 714/773 |
| 2013/0036256 A1* | 2/2013 | Kawamura | G06F 3/0623 711/103 |
| 2013/0080732 A1* | 3/2013 | Nellans | G06F 12/0246 711/206 |
| 2013/0124787 A1* | 5/2013 | Schuette | G06F 12/0246 711/103 |
| 2015/0160879 A1* | 6/2015 | Flynn | G06F 3/061 711/103 |

FOREIGN PATENT DOCUMENTS

| | | |
|---|---|---|
| JP | 2000076116 | 3/2000 |
| JP | 2007293917 | 11/2007 |
| WO | WO2011095516 A1 | 8/2011 |

OTHER PUBLICATIONS

Japanese Office Action dated Nov. 26, 2015 for Japanese patent application No. 2014-549505, a conterpart foreign application of U.S. Appl. No. 14/369,680.
Second Affidavit of Christopher Butler from Internet Archives, May 2017, Patent Trial and Appeal Board, *SanDisk v. Memory Technologies*, U.S. Pat. No. 9,063,850, SanDisk Exhibit 1020, 2 pgs.
Affidavit of Christopher Butler from Internet Archives, Feb. 2017, Patent Trial and Appeal Board, *SanDisk v. Memory Technologies*, U.S. Pat. No. 8,307,180, SanDisk Exhibit 1011, 8 pgs.
Assignment History for U.S. Pat. No. 6,279,114, downloaded from USPTO Website Mar. 2018, 2 pg.
Assignment History for U.S. Pat. No. 7,409,489, downloaded from USPTO Website Mar. 2018, 1 pg.
Assignment History for U.S. Pat. No. 7,478,248, downloaded from USPTO Website Mar. 2018, 1 pg.
Business Wire, "CompactFlash Association Announces Availability of Revision 3.0 of the CF+ & CompactFlash Specification; Revision 3.0 Increases CF Interface Data Transfer Rate to 66MG/sec" Jan 2005, SanDisk Exhibit 1018, Patent Trial and Appeal Board, *SanDisk v. Memory Technologies*, U.S. Pat. No. 8,307,180, 3 pgs.
CFA, "CF+ and CompactFlash Specification, Revision 3.0", Dec. 2004, SanDisk Exhibit 1003, Patent Trial and Appeal Board, *SanDisk v. Memory Technologies*, U.S. Pat. No. 8,307,180, 186 pgs.
"Declaration of R. Jacob Baker, Ph.D., P.E. In Support of Petition for Inter Partes Review of U.S. Pat. No. RE45,486", SanDisk Exhibit 1009, Mar. 2017, 146 pages.
File History for U.S. Pat. No. 8,307,180, downloaded Mar. 2018 from USPTO Website, 4 pgs.
File History for U.S. Pat. No. 9,063,850, downloaded Mar. 2018 from USPTO Website, 4 pgs.
Jedec, "MuliMediaCard Association (MMCA) and the JEDEC Solid State Technology Association (JEDEC) Announce eMMC for Embedded Flash Memory Applications", Dec. 2006, SanDisk Exhibit 1022, Patent Trial and Appeal Board, *SanDisk v. Memory Technologies*, U.S. Pat. No. 9,063,850, 4 pgs.
McGraw-Hill Electronics Dictionary, Sixth Edition 1997, Definition of "Register", SanDisk Exhibit 1013, Patent Trial and Appeal Board, *SanDisk v. Memory Technologies*, U.S. Pat. No. 8,307,180, 3 pgs.
"The MultiMediaCard", System Specification, Version 1.4, MMCA Technical Committee, SanDisk Exhibit 1009, Patent Trial and Appeal Board, *SanDisk v. Memory Technologies*, U.S. Pat. No. 8,307,180, cited in IDS Nov. 1998, 106 pgs.
Horak, Webster's New World Telecom Dictionary Copyright 2008, Definition of "Register", SanDisk Exhibit 1027, Patent Trial and Appeal Board, *SanDisk v. Memory Technologies*, U.S. Pat. No. 8,307,180, 4 pgs.
Excerpts from Patent Owner's Proposed Construction in Related ITC Matter, "Complainant's Proposed Claim Constructions with Support", SanDisk Exhibit 1026, Patent Trial and Appeal Board, *SanDisk v. Memory Technologies*, U.S. Pat. No. 8,307,180, May 3, 2017, 6 pgs.
Choudhury et al., "Public Key Infrastructure Implementation and Design", SanDisk Exhibit 1022, Patent Trial and Appeal Board, *SanDisk v. Memory Technologies*, U.S. Pat. No. 8,307,180, May 3, 2017, 320 pgs.

(56) References Cited

OTHER PUBLICATIONS

Declaration of Stephen Gross, Before the Patent Trial and Appeal Board, *SanDisk* v. *Memory Technologies*, U.S. Pat. No. 8,307,180, SanDisk Exhibit 1015, May 3, 2017, 3 pgs.

Exhibit A to Second Affidavit of Christopher Butler, Patent Trial and Appeal Board, *SanDisk* v. *Memory Technologies*, U.S. Pat. No. 8,307,180, SanDisk Exhibit 1021, May 10, 2017, 6 pgs.

IBM Dictionary of Computing, Tenth Edition Aug. 1993, Definition of "Register", SanDisk Exhibit 1020, Patent Trial and Appeal Board, *SanDisk* v. *Memory Technologies*, U.S. Pat. No. 8,307,180, May 10, 2017, 3 pgs.

* cited by examiner

METHOD FOR ERASING DATA ENTITY IN MEMORY MODULE

This Application is a § 371 national stage entry of International Application No. PCT/FI2011/051168, filed Dec. 29, 2011, the entirety of which is incorporated herein by reference.

TECHNICAL FIELD

The present invention relates generally to memory modules. The invention relates particularly, though not exclusively, to erasing a data entity in the memory module.

BACKGROUND ART

Today's memory module interfaces may hide the used memory technology. The host software does not have to adapt to various memory technologies and architectures. However, this poses a problem that memory modules are not able to efficiently handle the wear leveling and erasing functions. For example, if the memory card is once written full, it will internally appear as full even if all the files that were stored in it will be deleted. The reason for this is that in a normal file system implementation, data will just be written to the memory card and new data will just overwrite the old one. Files are deleted only from the file allocation table by writing the reserved file/cluster entries to be non-reserved.

In a managed NAND memory subsystems a memory controller takes care of flash management functions like bad block management and wear leveling. The memory controller is not aware of file system level details of data but only managing reading/writing sectors of data without understanding the possible relationship between different sectors (e.g. if certain sectors belong to same or different file).

When an external host deletes a file the host marks the corresponding allocation in file allocation table (FAT) as free. A sophisticated host operating system and/or file system may also perform a so-called trimming function to sectors which the file covered. Depending on how fragmented the file allocation table (FAT) is, several commands may be needed to trim all sectors belonging to a file.

BRIEF SUMMARY OF THE INVENTION

According to a first example aspect of the invention there is provided a method comprising:
  storing a data entity using at least two sectors of a memory device, the at least two sectors associated to the same data entity;
  maintaining, at a memory controller, context information of the data entity comprising a pointer to at least one of the at least two sectors of the memory device; and
  erasing the at least two sectors of the memory device using the context information.
In an embodiment, the method may further comprise:
  defining, at the memory controller, a signal indicative of erasing at least one of the at least two sectors from the memory device.
In an embodiment, the method may further comprise:
  deleting, by the host, a data entity entry from a file allocation table in response to a delete signal from an external host application; and
  generating the signal indicative of erasing at least one of the at least two sectors from the memory device in response to the deletion of the data entity entry from the file allocation table.

The pointer may comprise a start address indicating a logical address of a first sector of the memory device and a start address indicating a logical address of a second sector of the memory device. The pointer may also comprise a start address indicating a physical address of a first sector of the memory device and a start address indicating a physical address of a second sector of the memory device.

A context identifier may be defined for the context information. Furthermore, a group number or an associative command may be defined for the context information.

In an embodiment, the method may further comprise erasing the at least two sectors of the memory device in response to the signal indicative of erasing at least one of the at least two sectors, associated with the context identifier.

In an embodiment, the method may further comprise erasing, by an erasing function, the at least two sectors of the memory device using at least one of the following commands:
  ERASE;
  TRIM;
  SecureTRIM;
  SecureERASE;
  DISCARD;
  Sanitize; and
  Unmap (UFS).

In an embodiment, the method may further comprise generating, by the erasing function, a first signal indicative of erasing the first sector and a second signal indicative of erasing the second sector. The sector may comprise at least one of the following:
  an erase block;
  a write block;
  a page;
  a super page (set of pages); and
  a sector (e.g. of a hard drive).

According to a second example aspect of the invention there is provided a memory module, comprising:
  at least one memory device;
  a memory controller having an interface to an external host and to the at least one memory device;
  the memory device including computer program code, the computer program code being configured to, with the memory controller, cause the memory module at least to:
  store a data entity using at least two sectors of a memory device, the at least two sectors associated to the same data entity;
  maintain, at a memory controller, context information of the data entity comprising a pointer to at least one of the at least two sectors of the memory device; and
  erase the at least two sectors of the memory device using the context information.

In an embodiment, the computer program code being further configured to, with the memory controller, cause the memory module at least to:
  define, at the memory controller, a signal indicative of erasing at least one of the at least two sectors from the memory device.

A data entity entry may be deleted, by the host, from a file allocation table in response to a delete signal from an external host application; and the signal indicative of erasing at least one of the at least two sectors from the memory device may be generated in response to the deletion of the data entity entry from the file allocation table.

In an embodiment, the sector comprises at least one of the following:

an erase block;
a write block;
a page;
a super page (set of pages); and
a sector (e.g. of a hard drive).

In an embodiment, the memory module comprises at least one of the following:
an Embedded MultiMediaCard (eMMC);
a memory card (SD);
an Advanced Technology Attachment (ATA); and
a Universal Flash Storage (UFS).

According to a third example aspect of the invention there is provided a computer program embodied on a computer readable medium comprising computer executable program code which, when executed by at least one controller of a memory module, causes the memory module to:

store a data entity using at least two sectors of a memory device, the at least two sectors associated to the same data entity;

maintain, at a memory controller, context information of the data entity comprising a pointer to at least one of the at least two sectors of the memory device; and erase the at least two sectors of the memory device using the context information.

Any foregoing memory medium may comprise a digital data storage such as a data disc or diskette, optical storage, magnetic storage, holographic storage, opto-magnetic storage, solid state memory, phase-change memory, resistive random access memory, magnetic random access memory, solid-electrolyte memory, ferroelectric random access memory, organic memory or polymer memory. The memory medium may be formed into a device without other substantial functions than storing memory or it may be formed as part of a device with other functions, including but not limited to a memory of a computer, a chip set, and a sub assembly of an electronic device.

Different non-binding example aspects and embodiments of the present invention have been illustrated in the foregoing. The above embodiments are used merely to explain selected aspects or steps that may be utilized in implementations of the present invention. Some embodiments may be presented only with reference to certain example aspects of the invention. It should be appreciated that corresponding embodiments may apply to other example aspects as well.

BRIEF DESCRIPTION OF THE DRAWINGS

The invention will be described, by way of example only, with reference to the accompanying drawings, in which.

DETAILED DESCRIPTION

In the following description, like numbers denote like elements.

Figure 1:
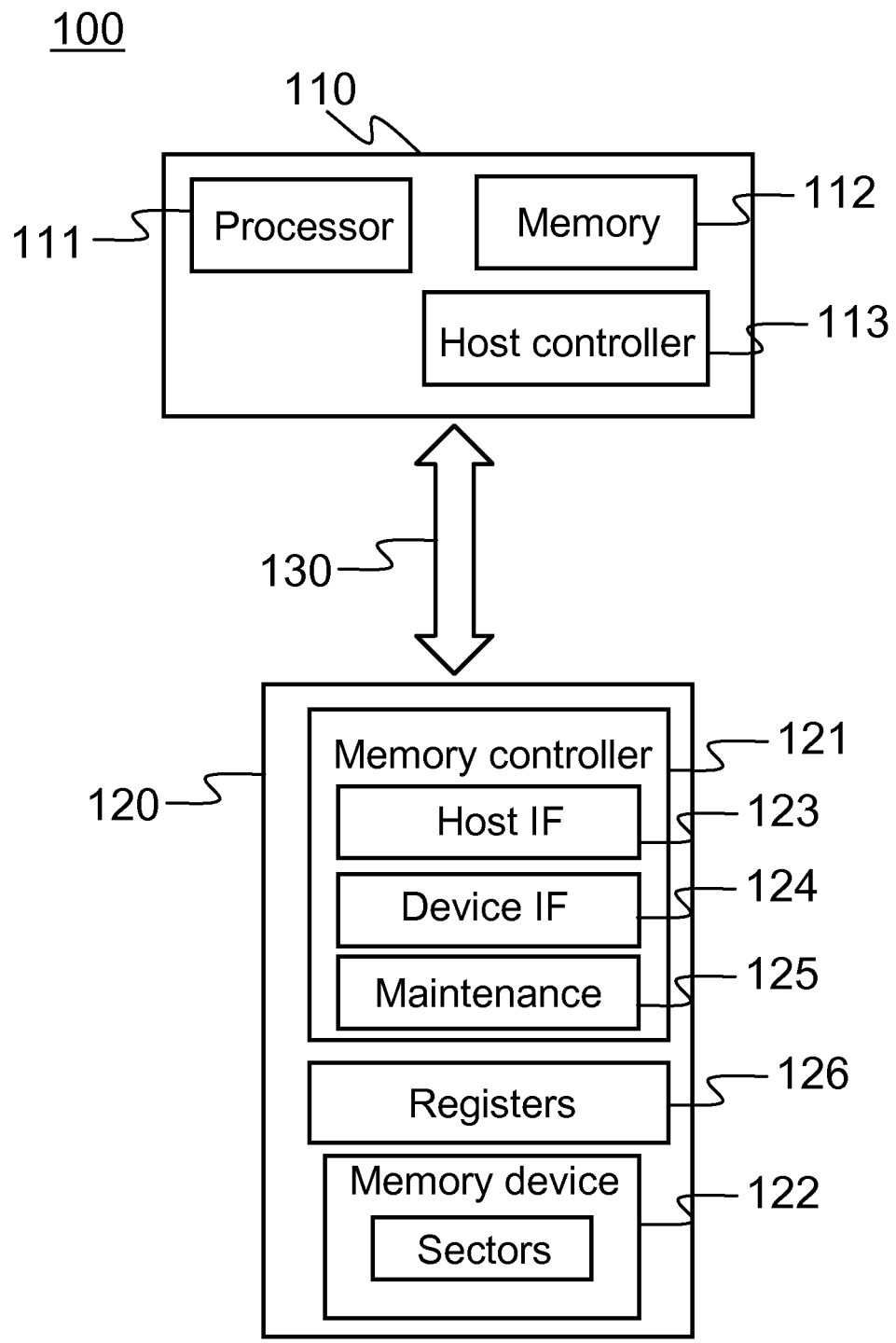
FIG. 1 shows some details of the system architecture in which various embodiments of the invention may be applied.

FIG. 1 shows some details of the system 100, in which various embodiments of the invention may be applied. The system comprises an external host 110, such as a user apparatus, a user equipment (UE), and a memory module 120. Additionally the system comprises an interface 130 for communicating data, control signals and clock signal between the host 110 and the memory module 120.

The memory module 120 may comprise for example a memory card, a MultiMediaCard (MMC), a secure digital (SD) card or an embedded memory. The memory module 120 may comprise a memory controller 121 and at least one memory device 122. The memory device 122 may comprise memory blocks with multiple sectors for storing data. The memory controller 120 may comprise a host interface controller 123 for facilitating communications with the host device 110, a memory interface controller 124 for facilitating communications and operations (e.g., read, write or erase operations) with the memory device 122 and a memory maintenance controller 125. In an embodiment, the controllers 121, 123-125 may be logical circuits.

In an embodiment, when the memory module 120 is connected to a host (electronic) device 110, the host controller 113 may provide a command signal over the interface 130 to the host interface controller 123. In the memory device 122, a data entity, such as a file, is stored using at least two sectors of the memory device 122.

In an embodiment, a sector may comprise at least one of the following:
an erase block (NAND);
a write block (eMMC);
a page (NAND);
a super page (set of pages); and
a sector (e.g. of a hard drive).

To better differentiate between large sequential operations and small random operations, and to improve multitasking support, contexts can be associated with groups of read or write commands. Associating a group of commands with a single context allows the device to optimize handling of the data. A faster solution to erase fragmented sectors is also needed.

A context can be seen as an active session, configured for a specific read/write pattern (e.g. sequential in some granularity). Multiple read or write commands are associated with this context to create some logical association between them, to allow device to optimize performance. For example, a large sequential write pattern may have better performance by allowing the device to improve internal locality and reduce some overheads (e.g. if some large unit of data is allowed to be affected by a power failure as a whole while it is being written to, all of the commands that fill this unit can work faster because they can reduce the overhead usually required to protect each write individually in case of a power failure).

Device may support one or more concurrent contexts, identified by a context identifier (context ID). To use a context, an available context ID shall be picked. Then, it shall be initialized by writing to a configuration register. Then, data can be read/written associated to the context by specifying the context ID in command before sending the read/write command. When the context is no longer used, the configuration register should be updated to close the context ID. A context shall be closed prior to re-configuring it for another configuration/use.

In an embodiment, a memory device location, such as a sector, may be indicated using a pointer. The pointer may comprise for example a logical address or a physical address of the memory device location.

At the memory controller 121 of the memory module 120, context information may be maintained of the data entity. The context information may comprise logical addresses of the at least two sectors of the memory device 122. At the memory controller 121, a signal may be defined indicative of erasing the at least two sectors from the memory device 122. The at least two sectors of the memory device 122 may be then erased using the context information.

As described herein, the signal received from the host 110 may comprise a context ID for a data entity to be erased from the memory device 122 comprised by at least two sectors. The context ID identifies the context information comprising a pointer. The pointer may comprise a start address indicating a logical address of a first sector of the memory device 122 and a start address indicating a logical address of a second sector of the memory device 122. Erasing of the data entity may comprise erasing all the sectors comprising data relating to the data entity or at least one sector comprising data relating to the data entity.

In an embodiment, erasing may be implemented using at least one of the following functions:
ERASE (eMMC);
TRIM (eMMC/ATA);
SecureTRIM/SecureERASE (eMMC);
DISCARD (eMMC);
Sanitize (eMMC); and
Unmap (UFS).

In an embodiment, the erasable unit may be defined as an erase group. The erase group is measured in write blocks, which are the basic writable units. The size of the erase group is a device specific parameter. The content of an explicitly erased memory range shall be '0' or '1' depending on different memory technology. Once the ERASE command completes successfully, the mapped device address range that was erased shall behave as if it was overwritten with all '0' or all '1' depending on the different memory technology. The impact of the ERASE command should be simply moving the mapped host address range to the unmapped host address range. The host can erase a contiguous range of Erase Groups. Starting the erase process is a three steps sequence. First the host defines the start address of the range using the ERASE_GROUP_START command, next it defines the last address of the range using the ERASE_GROUP_END command and finally it starts the erase process by issuing the ERASE command with argument bits set to zero. The address field in the erase commands is an erase group address, in byte units for densities up to 2 GB, and in sector units for densities greater than 2 GB.

In an embodiment, a trimming function TRIM is similar to the ERASE function described above. The function applies the erase operation to write blocks instead of erase groups. The trimming function TRIM allows the host to identify data that is no longer required and to erase the data if necessary during background erase events. The contents of a write block where the trim function has been applied may be '0' or '1' depending on different memory technology.

Once the trimming function completes successfully, the mapped device address range that was trimmed shall behave as if it was overwritten with all '0' or all '1' depending on the different memory technology. The impact of the trim command should be simply moving the mapped host address range to the unmapped host address range. Completing the TRIM process is a three steps sequence. First the host may define the start address of the range using the ERASE_GROUP_START command, next it defines the last address of the range using the ERASE_GROUP_END command and finally it starts the erase process by issuing the ERASE command with argument bit 0 set to one and the remainder of the arguments set to zero.

In an embodiment, a sanitize function may be used, to remove data from the device. The use of the sanitize operation requires the device to physically remove data from the unmapped user address space. After the sanitize operation is completed, no data should exist in the unmapped host address space. Since the region being operated on is not accessible by the host, applications requiring this feature must work with individual device manufacturers to ensure this operation is performing properly and to understand the impact on device reliability.

In an embodiment, a discard function may be used for erasing. The DISCARD is similar operation to TRIM. The discard function allows the host to identify data that is no longer required so that the device can erase the data if necessary during background erase events. The contents of a write block where the discard function has been applied shall be 'don't care'. After discard operation, the original data may be remained partially or fully depend on device. The device will decide the contents of discarded write block. The distinction between DISCARD and TRIM is the device behavior, where the device is not required to guarantee that host would not retrieve the original data from one or more logical block address's that were marked for erase when a read operation is directed. The TRIM shall response with either '0' or '1', depending on different memory technology. Completing the discard process is a three steps sequence. First the host defines the start address of the range using the ERASE_GROUP_START command, next it defines the last address of the range using the ERASE_GROUP_END command and finally it starts the erase process by issuing the ERASE command with argument bit 0 and bit 1 set to one and the remainder of the arguments set to zero. In the case of the discard operation the commands may identify the addresses of write blocks rather than erase groups.

In an embodiment, a secure erase function may be used. A secureERASE command indicating a secure purge may be performed on an erase group. The secure erasing should be done not only to the data in this erase group but also on any copies of this data in separate erase groups. This command is executed immediately, and the memory device will not return control to the host until all necessary erase groups are purged. One erase group is the minimum block of memory that can be erased on a particular NAND flash, for example.

In an embodiment, a secure trim function may be used. Similar to the secureERASE, the secureTRIM command operates on write blocks instead of erase groups. To handle this properly, the operation may be divided into two steps. The first step marks blocks for secure purge that can be done to multiple sets of blocks before the second step is called. The second step is an erase with a separate bit flag sequence that performs all the requested secure trims.

Erasing the sectors of the memory device 122 may be utilized by the host 110, for example, according to an embodiment of the present invention. As described herein, the memory maintenance controller 125 may manage a memory maintenance comprising possible erasing sectors or blocks. After deleting the data item in file system level from the file allocation table (FAT), the host 110 may be further configured to perform collecting together all sectors marked as deleted and possibly logically/physically erasing the plurality of sectors marked as deleted. The host 110 may also perform garbage collection and memory wear leveling of the memory device 122 after deleting. Furthermore, the memory maintenance controller 125 may be further configured to perform collecting together all sectors marked to be erased, based on instructions from the host, and possibly logically/physically erasing the plurality of sectors. Based on the instructions from the host 110, the memory maintenance controller 125 may perform memory wear leveling of the memory device 122 after erasing.

In an embodiment, the memory controller 121, the host interface controller 123, the memory device controller 124, the memory maintenance controller 125, and the memory device 122 may be implemented as a software module, a hardware module or a combination thereof. Furthermore, each of the modules 121-125 may be implemented as a separate module/block or can be combined with any other standard module/block of the memory module 120, or it can be split into several blocks according to their functionality. All or selected modules/blocks of the memory module 120 may be implemented using one integrated circuit.

In an embodiment, registers 126 shown in FIG. 1 are configured to store register information, such as earlier described configuration register. The registers 126 may also be located in the memory device 122, for example. The registers may be accessed by the memory controller 121.

Figure 2:
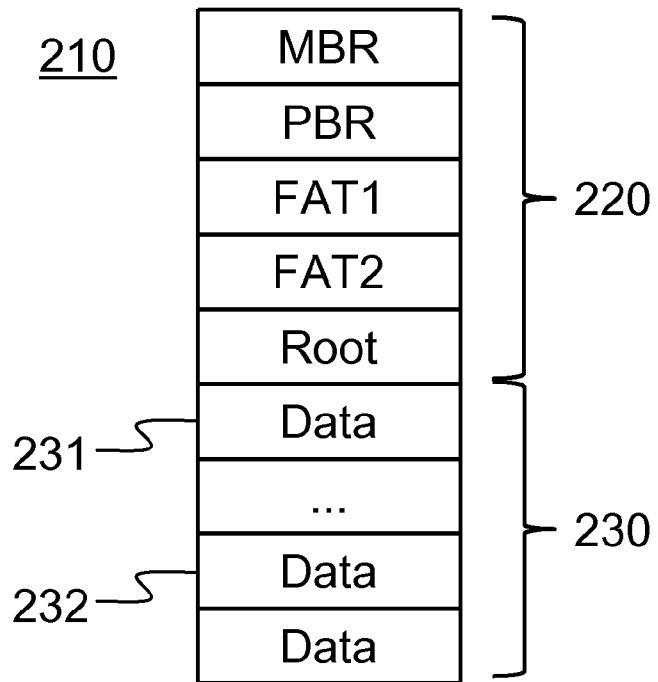
FIG. 2 shows some details of the memory device, in which various embodiments of the invention may be applied.

FIG. 2 shows some details of the memory device 122, in which various embodiments of the invention may be applied.

In an embodiment, in a file system implementation, data will be written to the memory device, for example, and new data will just overwrite the old one. Files are deleted only from a file allocation table (FAT) by writing the reserved file/cluster/sector entries to be non-reserved. Erasing data from the memory device is a separate function.

When writing data to the flash memory via a logical interface, the host typically assigns unique logical addresses to sectors, clusters or other units of data within a continuous virtual address space of the memory system. The host typically maintains a file system and allocates file data to logical clusters, where the cluster size is typically fixed. A flash device is divided into plural logical sectors and the host allocates space within the clusters comprising of a plurality of logical sectors. A cluster is a subdivision of logical addresses and a cluster map may be designated as a file allocation table (FAT). The file allocation table (FAT) is normally stored on the storage device itself.

A continuous logical address space is large enough to provide addresses for all the data that may be stored in the memory device 122. The host address space is typically divided into increments of sectors or clusters of data. Each cluster may be designed in a given host system to contain a number of sectors of data, somewhere between 4 and 64 sectors being typical. A standard sector contains 512 or 4096 bytes of data, for example.

FIG. 2 shows an example of how memory device 122 is typically partitioned. Storage device 122 may include a plurality of partitions, and in FIG. 2 a single partition 210 is shown for simplicity. The partition 210 includes a system area 220 and a data area 230. The system area 220 has various segments, for example, the master boot record ("MBR") area, partition boot record ("PBR") area, FAT1 area, FAT2 area and root directory area.

MBR area stores overall partition information, and if the media is a bootable device, then MBR includes instructions to jump from MBR area to PBR area. MBR area also includes hidden area, which is reserved space between MBR area and PBR area.

PBR area includes partition/boot information for a partition. For example, PBR area includes information for the type of the file allocation table (FAT) (for example, 12/16/32 bits); a label (i.e. name of the drive), size of the drive; cluster size (i.e. the number of sectors per allocation unit); number of file allocation table (FAT) areas (2 FAT areas FAT1 and FAT2 shown in FIG. 2) and the number of sectors per file allocation table (FAT). File allocation table (FAT) areas contain sector/cluster information for each file. For example, for FAT-12, each entry in file allocation table (FAT) area contains 12 bits and there are a total of 4096 entries.

Root directory contains entries for each file. Each directory entry includes a certain number of bytes for file name or directory (for example, 8 bytes); a number of bytes for extension (for example, 3 bytes), a number of bytes (for example, 1 byte) for file attributes (for example, if a file is read only, hidden, system file, volume label, directory or modified); a number of bytes indicating the time and date when a file was created; a certain number of bytes (for example 2) for a starting sector/cluster; and a certain number of bytes (for example 4) indicating the file length. The number of bytes for the starting sector/cluster points to the first sector/cluster in the file allocation table (FAT) and the last sector/cluster may be indicated by 0xFFF or 0Xffffff, for example.

In order to write a file name in the directory, the host system finds free sector/cluster space in FAT1 area and data is written in the data area 230. Both FAT1 and FAT2 entries are then updated. The directory entry i.e., the date/time/starting sector/cluster/file length is also updated.

In an embodiment, a data entity, for example a file, is stored to the memory device 122 in a partition 210. The data entity is stored in two sectors 231, 232. A context configuration may be defined for the data entity, identified by a context ID. Configuration may be done by writing to the configuration register of the specific context ID required. Then, all read commands or write commands that are associated with this context ID shall be sent with the ID. When the context is no longer needed, it should be closed by writing a zero byte to the configuration register. The configuration registers are an array of 15 byte registers, for example, one for each context (except the fixed, pre-defined #0). Different rules may be defined also for new data to be later on added to the same file/context ID. The ID index of the configuration register can be re-opened after closing it and the ID index can always create new entity. However, after data has been successfully written to an ID index and the context ID has been closed, the data is logically grouped together. There is no exposure of this grouping to the host but the memory controller has means for figuring this out from spare pages of NAND, headers of pages or stored data, for example.

In an embodiment, a host decides to delete a data entity, such as a file, In response to receiving a deleting signal from the host application, the host marks the corresponding allocation in the file allocation table (FAT) as free. Furthermore, erasing the data entity located in the sectors 231, 232 of the memory device may also be desired. The sectors 231, 232 may be erased using separate trimming functions for each sector 231, 232.

In an embodiment, more efficient way to erase a file comprised by a plurality of sectors is introduced by reducing overhead of sending more than one trimming commands from the host to the memory device. The memory controller may be informed that certain parts of data entity (file) belong together and a specific single trimming function may be defined to apply to such data as a whole. Such function is independent of the number/address of the sectors covered by the file. The function of context ID may be used for erasing the sectors 231, 232 comprising the data entity, such as the file. At least following options may exist.

First option is to introduce a specific context ID erase function. Either separate specific commands or a special parameter in existing command may be used. Furthermore, register setting may be used. The first option may utilize existing erase functions as is. Such erase functions may also be used for erasing single sectors of certain data entity, ID or file. Erase functions may comprise commands, such as Erase, SecureErase, TRIM, SecureTRIM, or Discard in JEDEC eMMC and UFS memory standards.

Second option is to introduce an address of a context ID to be used by an erase function. The erase function may use a start address or any address of the context ID and automatically erase all sectors belonging to the same context ID.

Third option is to introduce hierarchical erasing features. A context may comprise a superset of other contexts corresponding to a context ID providing a superset of other context ID's. Such hierarchy may enable that data written to context ID1 could be e.g. a database and data written to context ID2 could be an item in the ID1 database. Thus a single trimming command to an address of ID2 may invalidate and erase the item from the database, no matter how fragmented the locations of sectors belonging to the item are. Furthermore, a single trimming command to an address of ID1 may invalidate the whole database, also all the items belonging to it but written originally to ID2. There could also be a control register related to the hierarchy of the indexes.

Figure 3:
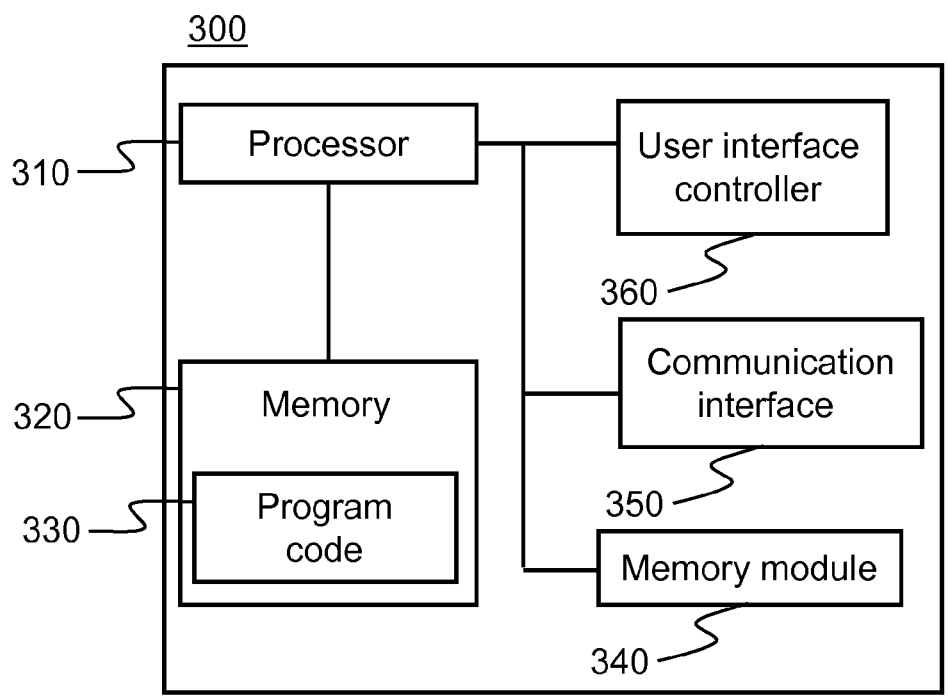
FIG. 3 presents an example block diagram of a user apparatus in which various embodiments of the invention may be applied.

FIG. 3 presents an example block diagram of a user apparatus 300 in which various embodiments of the invention may be applied. This may be a user equipment (UE), user device or apparatus, such as a mobile terminal, a laptop, a tablet, or other communication device.

The general structure of the user apparatus 300 comprises a communication interface module 350, a processor 310 coupled to the communication interface module 350, and a memory 320 coupled to the processor 310. The user apparatus further comprises software 330 stored in the memory 320 and operable to be loaded into and executed in the processor 310. The software 330 may comprise one or more software modules and can be in the form of a computer program product. The user apparatus 300 further comprises a user interface controller 360 coupled to the processor 310.

The communication interface module 350 implements at least part of the user data radio discussed in connection with various embodiments of the invention. The communication interface module 350 may be, e.g., a radio interface module, such as a WLAN, Bluetooth, GSM/GPRS, CDMA, WCDMA, or LTE (Long Term Evolution) radio module. The communication interface module 350 may be integrated into the user apparatus 300 or into an adapter, card or the like that may be inserted into a suitable slot or port of the user apparatus 300. The communication interface module 350 may support one radio interface technology or a plurality of technologies. FIG. 3 shows one communication interface module 350, but the user apparatus 300 may comprise a plurality of communication interface modules 350.

The processor 310 may be, e.g., a central processing unit (CPU), a microprocessor, a digital signal processor (DSP), a graphics processing unit, or the like. FIG. 3 shows one processor 310, but the user apparatus 300 may comprise a plurality of processors.

The memory 320 may be for example a non-volatile or a volatile memory, such as a read-only memory (ROM), a programmable read-only memory (PROM), erasable programmable read-only memory (EPROM), a random-access memory (RAM), a flash memory, a data disk, an optical storage, a magnetic storage, a smart card, or the like. The user apparatus 300 may comprise a plurality of memories. The memory 320 may be constructed as a part of the apparatus 300 or it may be inserted into a slot, port, or the like of the user apparatus 300 by a user. The memory 320 may serve the sole purpose of storing data, or it may be constructed as a part of an apparatus serving other purposes, such as processing data.

A memory module 340 may be included as a smart card used in the user apparatus 300. The memory module may be for example a non-volatile or a volatile memory, such as a read-only memory (ROM), a programmable read-only memory (PROM), erasable programmable read-only memory (EPROM), a random-access memory (RAM), a flash memory, a data disk, an optical storage, a magnetic storage, a smart card, or the like. The user apparatus 300 may comprise a plurality of memory modules 340. The memory module 340 may be inserted into a slot, port, or the like of the user apparatus 300 by a user. The memory 340 may serve the sole purpose of storing data, or it may be constructed as a part of an apparatus serving other purposes, such as processing data.

The user interface controller 360 may comprise circuitry for receiving input from a user of the user apparatus 300, e.g., via a keyboard, graphical user interface shown on the display of the user apparatus 300, speech recognition circuitry, or an accessory device, such as a headset, and for providing output to the user via, e.g., a graphical user interface or a loudspeaker.

A skilled person appreciates that in addition to the elements shown in FIG. 3, the user apparatus 300 may comprise other elements, such as microphones, displays, as well as additional circuitry such as input/output (I/O) circuitry, memory chips, application-specific integrated circuits (ASIC), processing circuitry for specific purposes such as source coding/decoding circuitry, channel coding/decoding circuitry, ciphering/deciphering circuitry, and the like. Additionally, the user apparatus 300 may comprise a disposable or rechargeable battery (not shown) for powering the user apparatus 300 when external power if external power supply is not available.

Figure 4:
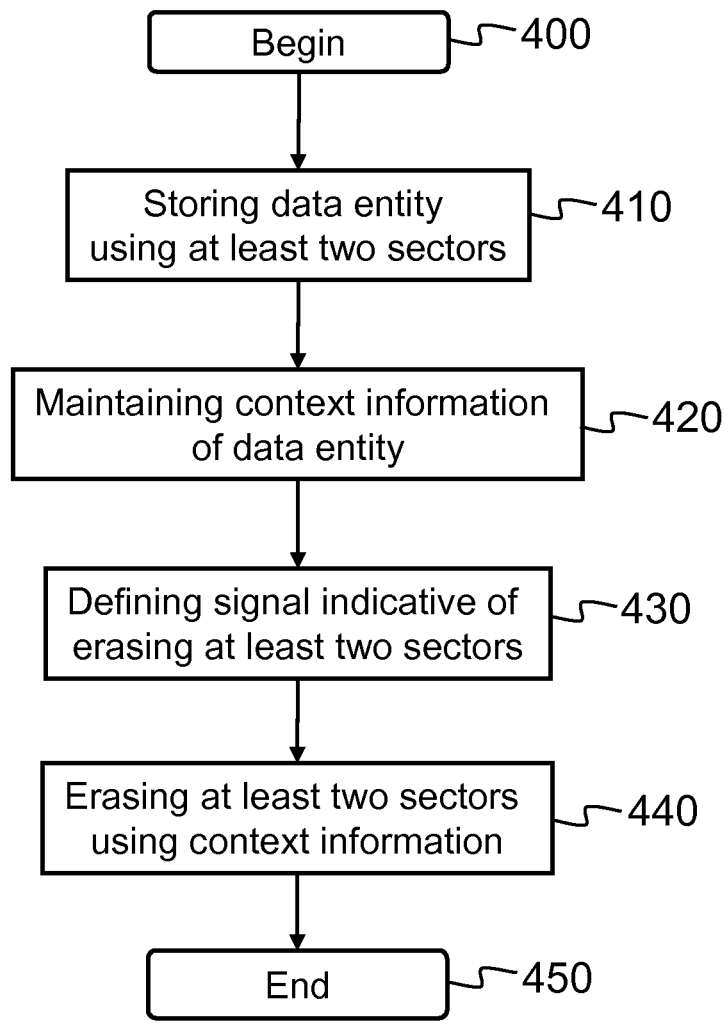
FIG. 4 shows a flow diagram showing operations in a memory module in accordance with an example embodiment of the invention.

FIG. 4 shows a flow diagram showing operations in a memory module in accordance with an example embodiment of the invention. In step 400, the method is started. In step 410, a data entity is stored using at least two sectors of a memory device, the at least two sectors associated to the same data entity. In step 420, at a memory controller of a memory module, context information of the data entity comprising a pointer to at least one of the at least two sectors of the memory device is maintained. At the memory controller, a signal is defined indicative of erasing the at least two sectors from the memory device in step 430. In step 440, the at least two sectors of the memory device are erased using the context information. The method ends in step 450.

Various embodiments have been presented. It should be appreciated that in this document, words comprise, include and contain are each used as open-ended expressions with no intended exclusivity.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means or in different combinations of embodiments without deviating from the characteristics of the invention.

Furthermore, some of the features of the above-disclosed embodiments of this invention may be used to advantage without the corresponding use of other features. As such, the foregoing description shall be considered as merely illustrative of the principles of the present invention, and not in limitation thereof. Hence, the scope of the invention is only restricted by the appended patent claims.

The invention claimed is:

1. A method comprising:
storing a data entity in at least two sectors of a memory device, the data entity including at least first data stored in a first sector of the at least two sectors and second data stored in a second sector of the at least two sectors;
receiving a first command to select a mode in which a second command indicative of erasing the first sector instructs a memory controller to erase at least the first sector and the second sector of the memory device;
maintaining, by the memory controller, context information of the data entity, the context information comprising at least a pointer to at least one of the at least two sectors of the memory device;
receiving the second command indicative of erasing the first sector; and
erasing the data entity stored in the at least two sectors of the memory device based at least on the context information, the mode selected via the first command, and the second command.

2. The method of claim 1, further comprising:
receiving, at the memory controller and from an external host, the second command to erase the first data stored in the first sector from the memory device.

3. The method of claim 1, wherein the pointer comprises at least a start address indicating a logical address of the second sector of the at least two sectors of the memory device.

4. The method of claim 1, wherein the pointer comprises at least a start address indicating a physical address of the second sector of the at least two sectors of the memory device.

5. The method of claim 1,
wherein the second command includes a context identifier or a group number associated with the context information.

6. The method of claim 1, further comprising:
receiving an associative command to associate the at least two sectors with the context information.

7. The method of claim 1, further comprising:
receiving, by the memory controller, a third command to store the first data and the second data in the at least two sectors of the memory device, wherein the third command includes at least a context identifier, and wherein the context information is based at least in part on the context identifier.

8. The method of claim 1, wherein the second command includes at least one of the following commands:
ERASE;
TRIM;
SecureTRIM;
SecureERASE;
DISCARD;
Sanitize; and
Unmap.

9. The method of claim 1, further comprising:
generating, by the memory controller, at least a first signal to erase both the first sector and the second sector.

10. The method of claim 1, wherein the first sector or the second sector of the at least two sectors comprises at least one of the following:
an erase block;
a write block;
a page;
a super page; and
a sector of a hard drive.

11. A memory module, comprising:
a memory device; and
a memory controller configured to communicate with an external host and to communicate with the memory device;
the memory controller configured to:
store a data entity in at least two sectors of the memory device, the data entity including at least first data and second data;
receive a first command to select a mode in which a second command indicative of erasing the first data instructs the memory controller to erase at least the first data and the second data stored in the memory device;
maintain context information of the data entity, the context information comprising at least a pointer to at least one of the at least two sectors of the memory device;
receive the second command indicative of erasing the first data; and
erase the at least two sectors of the memory device based at least on the context information, the mode selected via the first command, and the second command.

12. The memory module of claim 11, wherein the memory controller is further configured to:
receive, from the external host, the second command to erase the first data stored in a first sector of the at least two sectors from the memory device.

13. The memory module of claim 11, wherein a sector of the at least two sectors comprises at least one of the following:
an erase block;
a write block;
a page;
a super page; and
a sector of a hard drive.

14. The memory module of claim 11, wherein the memory module comprises at least one of the following:
an Embedded MultiMediaCard (eMMC);
a Secure Digital (SD) memory card;
an Advanced Technology Attachment (ATA); and
a Universal Flash Storage (UFS).

15. One or more non-transitory computer-readable media comprising computer-executable program code which, when executed by at least one memory controller of a memory module, causes the memory module to:
store a data entity in at least two sectors of a memory device, the data entity including at least first data stored in a first sector of the at least two sectors and second data stored in a second sector of the at least two sectors;
receive a first command to select a mode in which a second command indicative of erasing the first sector erases at least the first sector and the second sector of the memory device;
maintain context information of the data entity, the context information comprising at least a pointer to at least one of the at least two sectors of the memory device;

receive the second command indicative of erasing the first sector; and erase the at least two sectors of the memory device based at least on the context information, the mode selected via the first command, and the second command.

16. The one or more non-transitory computer-readable media of claim 15, wherein the computer-executable program code, when executed by the at least one memory controller of the memory module, further causes the memory module to: receive, from an external host device, the second command to erase the first data stored in the first sector of the at least two sectors from the memory device.

17. The one or more non-transitory computer-readable media of claim 15, wherein the second command indicates at least a context identifier associated with the data entity.

18. The one or more non-transitory computer-readable media of claim 15, wherein the second command includes a context identifier associated with the context information.

19. The one or more non-transitory computer-readable media of claim 15, wherein the computer-executable program code, when executed by the at least one memory controller of the memory module, further causes the memory module to: erase the at least two sectors of the memory device in response to the second command to erase the first data stored in the first sector of the at least two sectors.

20. The one or more non-transitory computer-readable media of claim 15, wherein the second command includes a group number associated with the context information.

21. The one or more non-transitory computer-readable media of claim 15, wherein the second command includes at least one of the following commands:
ERASE;
TRIM;
SecureTRIM;
SecureERASE;
DISCARD;
Sanitize; and
Unmap.

22. The one or more non-transitory computer-readable media of claim 15, wherein the pointer comprises at least a start address indicating a logical address of the second sector of the at least two sectors of the memory device.

23. The one or more non-transitory computer-readable media of claim 15, wherein the pointer comprises at least a start address indicating a physical address of the second sector of the at least two sectors of the memory device.

24. The one or more non-transitory computer-readable media of claim 15, wherein the computer-executable program code, when executed by the at least one memory controller of the memory module, further causes the memory module to:
receive an associative command to associate the at least two sectors with the context information.

25. The one or more non-transitory computer-readable media of claim 15, wherein the computer-executable program code, when executed by the at least one memory controller of the memory module, further causes the memory module to:
generate at least a first signal to erase both the first sector and the second sector.

26. The one or more non-transitory computer-readable media of claim 15, wherein the first sector or the second sector of the at least two sectors comprises at least one of the following:
an erase block;
a write block;
a page;
a super page; and
a sector of a hard drive.

27. The one or more computer-readable media of claim 24, wherein the memory module comprises at least one of the following:
an Embedded MultiMediaCard (eMMC);
a Secure Digital (SD) memory card;
an Advanced Technology Attachment (ATA); and
a Universal Flash Storage (UFS).

28. The method of claim 1, wherein the second command includes at least a context identifier associated with the data entity.

29. The method of claim 1, wherein the memory device comprises at least one of the following:
an Embedded MultiMediaCard (eMMC);
a Secure Digital (SD) memory card;
an Advanced Technology Attachment (ATA);
a Universal Flash Storage (UFS); and
NAND flash.

30. The memory module of claim 11, wherein the at least two sectors of the memory device include a first sector and a second sector, and wherein the pointer comprises at least a start address indicating a logical address of the second sector of the at least two sectors of the memory device.

31. The memory module of claim 11, wherein the first data is stored in a first sector of the at least two sectors of the memory device, wherein the second data is stored in a second sector of the at least two sectors of the memory device, and wherein the pointer comprises at least a start address indicating a physical address of the second sector of the at least two sectors of the memory device.

32. The memory module of claim 11, wherein the second command indicates at least a context identifier associated with the data entity.

33. The memory module of claim 11, wherein the second command includes at least a context identifier associated with the context information.

34. The memory module of claim 12, wherein the memory controller is further configured to:
erase the at least two sectors of the memory device in response to the second command to erase the first data stored in the first sector of the at least two sectors.

35. The memory module of claim 11, wherein the second command includes at least a group number associated with the context information.

36. The memory module of claim 11, wherein the memory controller is further configured to:
receive an associative command to associate the at least two sectors with the context information.

37. The host device of claim 11, wherein the second command includes at least one of the following commands:
ERASE;
TRIM;
SecureTRIM;
SecureERASE;
DISCARD;
Sanitize; and
Unmap.

38. The memory module of claim 11, wherein the first data is stored in a first sector of the at least two sectors of the memory device, wherein the second data is stored in a second sector of the at least two sectors of the memory device, and wherein the memory controller is further configured to:
generate at least a first signal to erase both the first sector and the second sector.

39. A memory module, comprising:
a memory device;
means for communicating with an external host and with the memory device;
means for storing a data entity in at least two sectors of the memory device, the data entity including at least first data stored in a first sector of the at least two sectors and second data stored in a second sector of the at least two sectors;
means for receiving a first command to select a mode in which a second command indicative of erasing the first sector instructs a means for erasing to erase at least the first sector and the second sector of the memory device;
means for maintaining context information of the data entity, the context information comprising at least a pointer to at least one of the at least two sectors of the memory device;
means for receiving the second command indicative of erasing the first sector; and
the means for erasing the at least two sectors of the memory device based at least on the context information, the mode selected via the first command, and the second command.

40. The memory module of claim 39, further comprising:
means for receiving, from the external host, the second command to erase the first data stored in the first sector of the at least two sectors from the memory device.

41. A host device, comprising:
a host controller configured to communicate with a memory module,
the host controller further configured to:
cause the memory module to store a data entity in at least two sectors of the memory module, the data entity including at least first data stored in a first sector of the at least two sectors and second data stored in a second sector of the at least two sectors, the data entity associated with a context identifier used for one or more write operations associated with the data entity;
transmit a first command to the memory module to select a mode in which a second command indicative of erasing the first sector instructs the memory module to erase multiple sectors of the memory module; and
transmit the second command to the memory module, the second command indicative of erasing the first sector.

42. The host device of claim 41, wherein the host controller is further configured to:
cause the memory module to delete a data entity entry from a file allocation table stored in the memory module, the data entity entry associated with the at least two sectors of the memory module.

43. The host device of claim 42, wherein the host controller is further configured to:
receive a delete signal from an external host application; and
cause the memory module to delete the data entity entry responsive to the delete signal.

44. The host device of claim 41, wherein the second command includes at least one of the following commands:
ERASE;
TRIM;
SecureTRIM;
SecureERASE;
DISCARD;
Sanitize; and
Unmap.

45. The memory module of claim 11, wherein the memory device is NAND flash memory.

* * * * *